(12) United States Patent
Kloiber et al.

(10) Patent No.: US 8,134,446 B2
(45) Date of Patent: Mar. 13, 2012

(54) ELECTRICAL COMPONENT WITH A SENSOR ELEMENT, METHOD FOR THE ENCAPSULATION OF A SENSOR ELEMENT, AND METHOD FOR PRODUCTION OF A PLATE ARRANGEMENT

(75) Inventors: Gerald Kloiber, Feldkirchen (AT); Adalbert Feltz, Deutschlandsberg (AT); Claus Cernoch, Vienna (AT)

(73) Assignee: Epcos AG, Munich (DE)

( * ) Notice: Subject to any disclaimer, the term of this patent is extended or adjusted under 35 U.S.C. 154(b) by 265 days.

(21) Appl. No.: 12/349,363

(22) Filed: Jan. 6, 2009

(65) Prior Publication Data

US 2009/0173526 A1    Jul. 9, 2009

Related U.S. Application Data

(63) Continuation of application No. PCT/DE2007/001120, filed on Jun. 25, 2007.

(30) Foreign Application Priority Data

Jul. 6, 2006  (DE) .................. 10 2006 031 344

(51) Int. Cl.
  *H01C 3/04*  (2006.01)

(52) U.S. Cl. ................ 338/28; 338/25; 29/612
(58) Field of Classification Search ............ 338/25, 338/28, 22 R; 29/611–612, 610.1, 620
See application file for complete search history.

(56) References Cited

U.S. PATENT DOCUMENTS

| 4,668,375 A | 5/1987 | Kato et al. |
| 4,771,261 A | 9/1988 | Benini |
| 4,818,363 A | 4/1989 | Bayha et al. |
| 5,142,266 A | 8/1992 | Friese et al. |
| 5,410,291 A | 4/1995 | Kuzuoka |
| 6,663,794 B2 | 12/2003 | Ogata et al. |
| 6,766,574 B2 | 7/2004 | Mizoguchi et al. |
| 2002/0075129 A1 | 6/2002 | Mizoguchi et al. |

FOREIGN PATENT DOCUMENTS

| DE | 32 06 903 A1 | 9/1983 |
| DE | 37 33 193 C1 | 11/1988 |
| DE | 43 29 312 A1 | 3/1994 |
| DE | 197 40 262 C1 | 4/1999 |
| DE | 101 24 373 A1 | 11/2001 |
| DE | 101 39 109 A1 | 3/2002 |
| GB | 2 186 438 A | 8/1987 |
| JP | 02-087032 | 3/1990 |
| JP | 3-500350 T | 1/1991 |
| JP | 04-150001 | 5/1992 |
| JP | 10-223405 A | 8/1998 |
| JP | 11-326072 | 11/1999 |
| JP | 2000-188208 A | 7/2000 |
| JP | 2002-048655 A | 2/2002 |
| JP | 2002-188966 A | 7/2002 |
| JP | 2006-169523 | 6/2006 |
| WO | WO 89/03115 A1 | 4/1989 |

*Primary Examiner* — Kyung Lee
(74) *Attorney, Agent, or Firm* — Slater & Matsil, L.L.P.

(57) ABSTRACT

An electrical component is specified with a sensor element, which is embedded in a plate arrangement. The plate arrangement includes at least three plates and conductor tracks, which are located between them and are conductively connected with the sensor element. At least two of the conductor tracks have exposed areas. Furthermore, a method for the encapsulation of a sensor element and a method for the production of a plate arrangement are specified.

23 Claims, 2 Drawing Sheets

ELECTRICAL COMPONENT WITH A SENSOR ELEMENT, METHOD FOR THE ENCAPSULATION OF A SENSOR ELEMENT, AND METHOD FOR PRODUCTION OF A PLATE ARRANGEMENT

This application is a continuation of co-pending International Application No. PCT/DE2007/001120, filed Jun. 25, 2007, which designated the United States and was not published in English, and which claims priority to German Application No. 10 2006 031 344.5 filed Jul. 6, 2006, both of which applications are incorporated herein by reference.

BACKGROUND

Components with sensor elements are known from German patent publication DE 101 39 109 A1. A sintered ceramic for NTC thermistors is known from German patent publication DE 197 40 262 C1.

SUMMARY

In one aspect, the present invention specifies an electrical component with a sensor element, which has a high mechanical stability and can be manufactured in a mass production, low cost method.

In other aspects, a method for the encapsulation of a sensor element and a method for the production of a plate arrangement with integrated conductor tracks are provided.

In accordance with a first preferred embodiment, an electrical component is specified with a sensor element that is embedded in a plate arrangement. The plate arrangement comprises at least three plates and conductor tracks arranged between the plates. The conductor tracks are conductively connected with the sensor element. At least two of the conductor tracks have exposed areas.

The component formed as a connecting element is characterized by a high mechanical stability and is suitable for use in high-temperature applications.

In accordance with a second preferred embodiment, an electrical component with a plate arrangement and a sensor element enclosed in it is specified. The plate arrangement comprises at least three plates provided with conductor tracks. The sensor element is conductively connected, with the conductor track of the middle plate via a conductor track, located on the inside of the outer plate. The inside of the outer plate is the side of this plate facing toward the middle plate—that is, the side facing away from the outside.

Advantageous developments of the two preferred embodiments are described below.

The sensor element is preferably made as a high-temperature-resistant temperature probe. The sensor element is designed, in an advantageous variant, as an NTC thermistor and comprises a body that contains the NTC ceramic. (NTC stands for Negative Temperature Coefficient.) The NTC ceramic is preferably resistant to aging. The ceramic composition is preferably based on a $Ba^{II}_x La^{III}_{1-x} Ti^{IV}_{x+y} Co^{II}_y Co^{III}_{1-x-2y} O_3$ phase-homogenous system with a perovskite structure. The ceramic with the specified composition is characterized by a high sensitivity with regard to a temperature measurement. Also, other ceramic materials described in the German patent publication DE 197 40 262 C 1 are suitable for the sensor element. The disclosure of this publication with regard to the ceramic materials is hereby incorporated by reference.

The body is preferably a flat structure with an arbitrary cross section. The body can be, for example, designed as a disk. Preferably, an electrode is located on both main surfaces of the body; it is conductively connected, with at least one of the conductor tracks of the plate arrangement.

The body is preferably sintered. The conductor tracks are placed and fired on, for example, in a screen printing process, on the plates, preferably as a conducting paste (conductive paste). The conductive paste, which is used for connection between the various conductor tracks and between the conductor tracks and the sensor element, preferably contains particles of AgPt, AgPd, and/or Pt. The conductor tracks and the electric connections with these characteristics are characterized by a high oxidation/reduction resistance.

The size of the plates is preferably selected in such a manner that steps with exposed areas of the conductor tracks are formed in at least one area of the plate arrangement.

The plates preferably have lateral dimensions that differ from one another. In one advantageous variant, the lateral dimension declines from the bottom up, or vice versa. In another variant, the middle plate can be constructed as two outer plates, so that an area of the middle plate juts out.

The plates comprise two outer plates and one middle plate, located between them, in which, one throughgoing opening is preferably formed to hold the sensor element. This opening can be replaced, in principle, by a niche formed in that the middle plate is offset relative to the outer plates. The dimension of this niche preferably matches that of the sensor element.

At least one of the outer plates can also have an opening, the cross-sectional size of which is, however, preferably clearly smaller than that of the sensor element.

In an advantageous variant, a first conductor track is formed on the first outer plate that is conductively connected with the sensor. An exposed area of the first conductor track preferably forms a first contact surface of the component.

A second printed conductor is preferably located on the middle plate. An exposed area of the second printed conductor preferably forms a second contact surface of the component.

Both contact surfaces are preferably contactable by one and the same side of the component. It is also possible, however, that the contact surfaces are contacted by two opposite sides.

A third conductor track is preferably located on the inside, that is to say the main surface of the second outer plate, facing the middle plate; the third conductor track conductively connects the sensor element with the second conductor track. The third conductor track is preferably completely buried in the plate arrangement.

In another variant, a conductor track, which is conductively connected with the sensor plate by means of a conductor track that is formed on the inside of the pertinent outer plate and preferably hidden, is formed on two main surfaces of the middle plate.

The plates preferably comprise an electrically insulating ceramic which incorporates, for example, Alox or $Si_3N_4$. Since the sensor element is integrated in a laminate of the stable plates with insulating characteristics, a good electrical insulation is guaranteed when operating the component.

The successive plates are preferably connected with one another by a connecting layer in the areas free of the conductor tracks. The connecting layer is preferably a cured ceramic adhesive. The connecting layer preferably comprises $Al_2O_3$ particles. The connecting layer can contain a high temperature glass whose softening temperature is above 1000° C.

The conductor tracks are preferably at a distance from the side edges of the plate arrangement. In particular, the exposed areas of the conductor tracks opposite the stepped edges can be drawn in.

The conductor tracks preferably have a thickness of 10 to 100 μm. The electrodes of the sensor element preferably have a thickness up to 20 μm. The plates preferably have a thickness of 0.2 to 1 mm.

The specified component can be used for temperature measurements in the vicinity of 1000° C. It is therefore advantageous for the areas of the conductor tracks provided as contact surfaces to be fused with connector leads.

The plate arrangement can be arranged in a metal shell.

Furthermore, a method for the encapsulation of a sensor element is specified. This method comprises the following steps. First, three plates with conductor tracks and a sensor element are prepared. The lower and the middle plates are put together, wherein the sensor element touches the conductor track of the lower plate. A conductive paste is preferably located on the area of this conductor track that is exposed before insertion of the sensor element, with the paste effecting a stable conductive connection between the sensor element and the conductor track later, after firing. The upper plate is connected with the middle plate in such a way that the sensor element is enclosed between the plates, wherein a conductor track located on the underside of the upper plate touches the conductor track of the middle plate and the sensor element.

Before placing of the upper plate, a conductive paste can be placed on the sensor element and/or the conductor track of the middle plate; the paste can effect a stable conductive connection between the sensor element and the conductor track of the upper plate and between the conductor tracks of the upper and middle plates, lying on one another.

The contacting internal conductor tracks of the successive plates encountering one another, can alternatively be solidly connected with one another by the following process. Conductive paste is introduced from below into the gap which is located between the plates and which comprises the area of the successive contacting conductor tracks. The conductive paste is preferably introduced via an opening formed in the lowermost plate.

After placing the upper plate, the plate arrangement with the enclosed sensor element is preferably heated to a temperature of about 800-1100° C., wherein the conductive paste is fired.

BRIEF DESCRIPTION OF THE DRAWINGS

The component with the embedded sensor element and the process steps will now be explained with the aid of schematic figures, which are not true to scale. The figures show the following.

Figure 1:
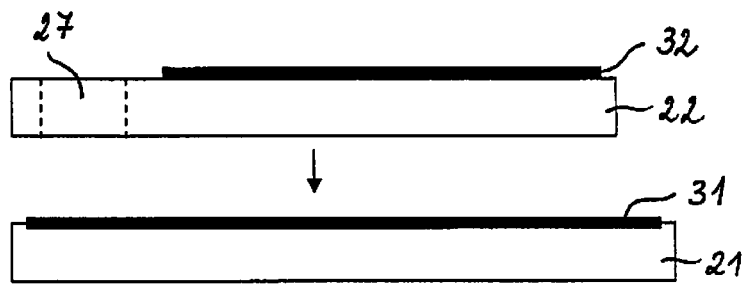
FIG. 1 shows the joining of the lower and the middle plates.

The following list of reference symbols can be used in conjunction with the drawings:
1 Sensor element
10 Body of the sensor element
11, 12 Electrodes of the sensor element
21 Lower plate
22 Middle plate
23 Upper plate
27, 28 Opening
31, 32, 33 Conductor track
31*a* Exposed area of the conductor track 31
32*a* Exposed area of the conductor track 32
41, 42, 43 Conductive paste
51, 52 Connecting layer

DETAILED DESCRIPTION OF ILLUSTRATIVE EMBODIMENTS

Figure 7:
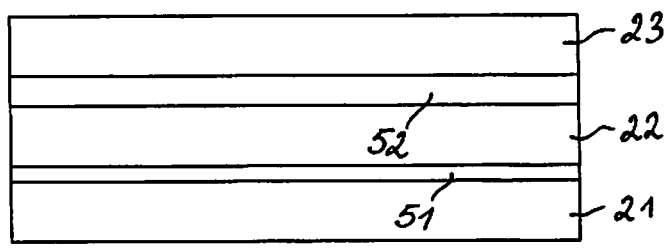
FIG. 7 shows the plate arrangement, in cross section, in an area which is free of conductor tracks.

FIG. 1 shows a first outer plate 21 and a middle plate 22, which are being put together. Before they are joined, a connecting layer 51, which can be seen in FIG. 7, is applied on at least one of these plates.

A first conductor track 31 is applied on the plate 21 and a second conductor track 32 is applied on the plate 22. The length of the conductor tracks 31, 32 is selected in such a way that they are at a distance from the edges of the pertinent plate.

Figure 2:
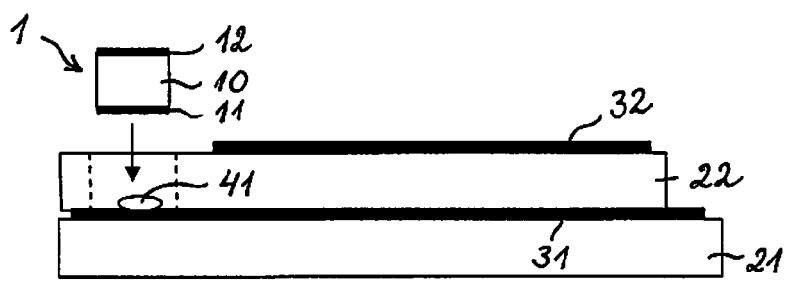
FIG. 2 shows the insertion of the sensor element.

The plate 22 has a throughgoing opening 27. After joining the plates 21, 22 (FIG. 2), a blind hole is formed by the opening 27 of the middle plate 22 and the surface of the lower plate 21; a part of the first conductor track 31 is located on its bottom. A conductive paste 41 is inserted into this blind hole, and then a sensor element 1.

The sensor element 1 comprises a body 10 and two electrodes 11, 12 between which the body 10 is located. The thickness of the body 10 is preferably essentially equal to the thickness of the middle plate 22.

The conductive paste 41 is placed between the lower electrode 11 of the sensor element 1 and the conductor track 31.

Figure 3:
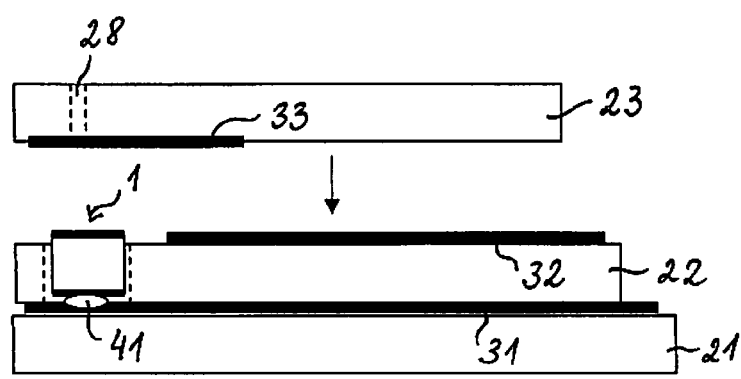
FIG. 3 shows the placement of the upper plate.

Subsequently, a second outer plate 23 is connected with the middle plate and the sensor element located therein (FIG. 3). Before they are put together, a connecting layer 52 is applied on at least one of the plates 22, 23. The connecting layer 52 can be seen in FIG. 7.

A third conductor track 33 is located on the side of the plate 23 facing inwards; it is pressed on the one hand against the electrode 12 of the sensor element 1 and on the other hand against the second conductor track 32.

Figure 4:
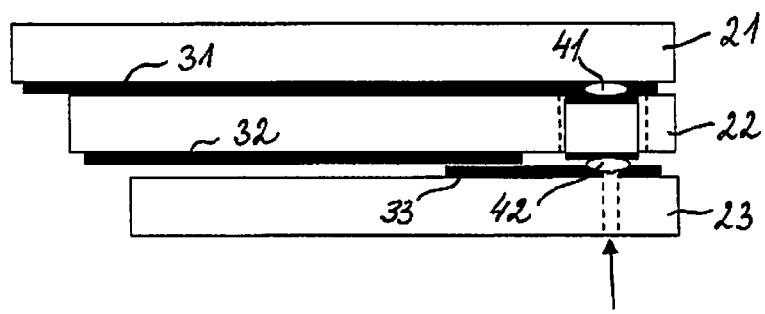
FIG. 4 shows the injection of the conductive paste into the interior space of the plate arrangement from below.

A throughgoing opening 28 is preferably formed in the plate 23; it is provided in the variant presented in FIG. 4 to introduce a conductive paste into the interior space formed between the plates 22, 23. This opening can open into an arbitrary location on the conductor track 33.

In a method variant presented in FIG. 4, the previously formed plate arrangement is reversed. A conductive paste 42 is injected from below, via the opening 28 of the second outer plate 23. Upon heating the plate arrangement, the conductive paste 42 wets the entire surface of the conductor track 33, wherein in particular, a solid and electrical connection is effected between the conductor tracks 33, 32 and between the conductor track 33 and the electrode 12 of the sensor element.

Figure 5:
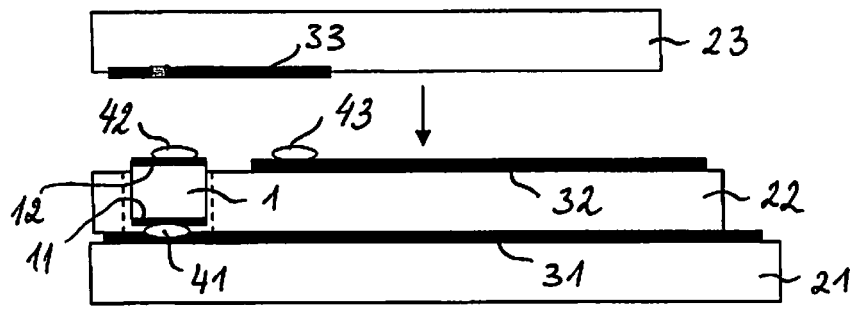
FIG. 5 shows the placement of the upper plate on the middle plate, wherein a conductive paste is placed between the conductor tracks before the joining of the plates.

Another variant is presented in FIG. 5, wherein the conductive paste 42, 43 is still located on at least one conducting surface before the application of the plate 23; depending on the orientation of the plate arrangement, it is selected from the conductor tracks 32, 33 and the electrode 12 of the sensor elements. In this case, the opening 28 can be dispensed with.

Figure 6:
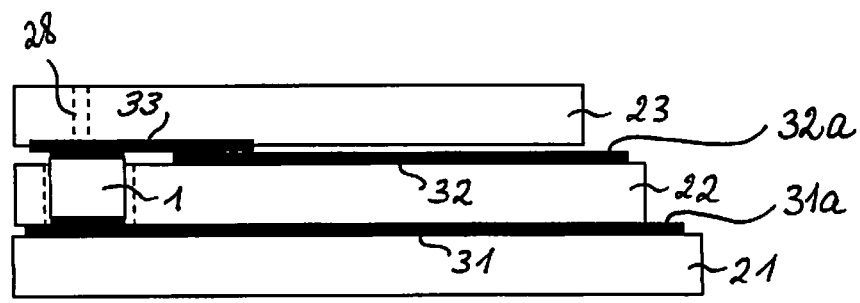
FIG. 6 shows a finished plate arrangement with the integrated sensor element.
Figure 8:
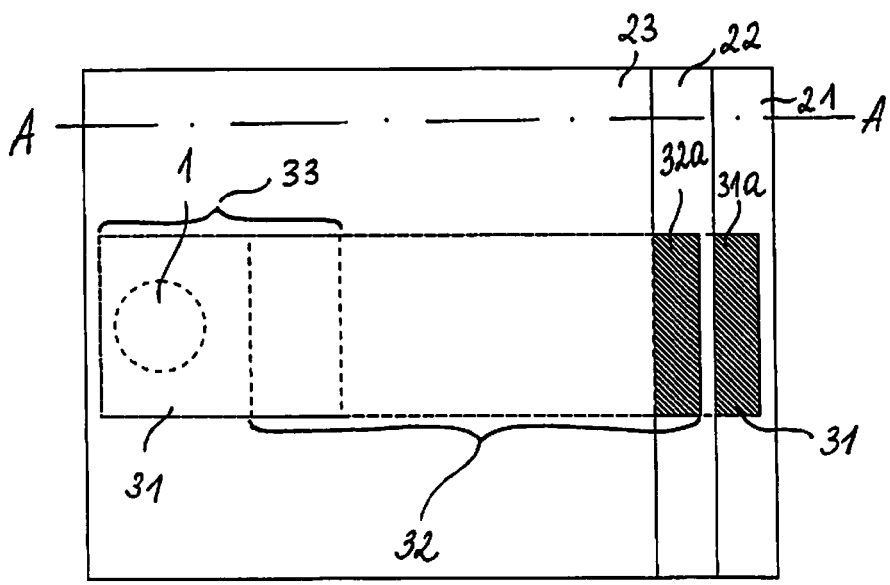
FIG. 8 shows a view from above of the plate arrangement according to FIGS. 6, 7.

The finished plate arrangement is shown in FIGS. 6, 7, and 8. The cross section AA is shown in FIG. 7, parallel to the longitudinal direction of the plate arrangement. The plate arrangement does not have any conductor tracks in this area.

A connecting layer 51 is located between the plates 21, 22, and another connecting layer 52 between the plates 22, 23. The connecting layer 52 can be slightly thicker than the layer 51, since two conductor tracks 32, 33 are located, above one another, between the plates 22, 23, whereas only one conductor track 31 is located between the plates 21, 22.

The plates 21, 22, 23 are dimensioned and laid above one another in such a way that on at least one end, their edges are staggered, in a transverse plane, relative to one another. The areas 31a, 32a of the first and the second conductor tracks 31, 32 are thereby exposed. The exposed areas 31a, 32a form contact surfaces, which are contactable from one and the same side in FIG. 6, from above.

The specified component is not limited to the form and number of the elements shown in the figures and to the specified materials.

What is claimed is:

1. An electrical component comprising:
    a plate arrangement; and
    a sensor element embedded in the plate arrangement;
    wherein the plate arrangement comprises first, second and third plates over one another and a first conductor track located between the first and second plates and a second conductor track located between the second and third plates, the first and second conductor tracks being electrically connected with the sensor element, wherein both the first and second conductor tracks have exposed areas.

2. The electrical component according to claim 1, wherein the sensor element comprises a temperature probe.

3. The electrical component according to claim 1, wherein the plates have sizes such that steps with the exposed areas of the conductor tracks are formed in at least one area of the plate arrangement.

4. The electrical component according to claim 1, wherein the second plate is located between the first and third plates, the second plate including an opening to hold the sensor element.

5. The electrical component according to claim 4, wherein the first conductor track is located on the first plate and wherein the exposed area of the first conductor track forms a first contact surface of the electrical component.

6. The electrical component according to claim 5,
    wherein the second conductor track is located on the second plate; and
    wherein the exposed area of the second conductor track forms a second contact surface of the electrical component;
    the electrical component further comprising a third conductor track that electrically connects the sensor element with the second conductor track, the third conductor track being located on a surface of the third plate facing the second plate.

7. The electrical component according to claim 6, wherein the third conductor track is completely buried in the plate arrangement.

8. The electrical component according to claim 1, wherein the exposed areas of the conductor tracks are both contactable from one side of the electrical component.

9. The electrical component according to claim 1, wherein the sensor element comprises a body that contains NTC ceramic.

10. The electrical component according to claim 1, wherein the plates comprise an electrically insulating ceramic.

11. The electrical component according to claim 1, wherein each plate is attached to an adjacent plate by a connecting layer.

12. The electrical component according to claim 1, wherein the conductor tracks comprise a fired metal paste.

13. The electrical component according to claim 1, wherein the conductor tracks are spaced from side edges of the plate arrangement.

14. The electrical component according to claim 1, wherein the exposed areas spaced from stepped edges of the plate arrangement.

15. An electrical component comprising:
    a plate arrangement; and
    a sensor element enclosed in the plate arrangement;
    wherein the plate arrangement comprises two outer plates and a middle plate between the two outer plates, each plate including a conductor track disposed on a surface thereof; and
    wherein the sensor element is electrically connected with the conductor track of the middle plate via the conductor track of the outer plate, said conductor track being located on an inside surface of the outer plate facing the middle plate.

16. The electrical component according to claim 15, wherein the sensor element comprises a temperature probe.

17. The electrical component according to claim 15, wherein the middle plate includes an opening to hold the sensor element.

18. The electrical component according to claim 15, wherein the sensor element comprises a body that contains NTC ceramic.

19. The electrical component according to claim 15, wherein the plates comprise an electrically insulating ceramic.

20. The electrical component according to claim 15, further comprising a first connecting layer attaching the middle plate to one of the outer plates and a second connecting layer attaching the middle plate to the other one of the outer plates.

21. The electrical component according to claim 15, wherein the conductor tracks comprise a fired metal paste.

22. The electrical component according to claim 15, wherein the conductor tracks are spaced from side edges of the plate arrangement.

23. A method of forming an electrical component, the method comprising:
    providing a sensor element, an upper plate, a middle plate and a lower plate, each plate having a conductor track disposed thereon;
    attaching the lower and the middle plates;
    inserting the sensor element into an opening of the middle plate, wherein the sensor element is electrically connected to the conductor track of the lower plate;
    attaching the upper plate to the middle plate so that the sensor element is enclosed among the plates, wherein a conductor track that is located on an internal surface of the upper plate is electrically connected to the conductor track of the middle plate and to the sensor element.

* * * * *